United States Patent [19]

Hebenstreit

[11] Patent Number: 4,866,556
[45] Date of Patent: Sep. 12, 1989

[54] CIRCUIT ARRANGEMENT OF A SELF PROTECTING POWER SWITCH

[75] Inventor: Ernst Hebenstreit, Munich, Fed. Rep. of Germany

[73] Assignee: Siemens Aktiengesellschaft, Berlin and Munich, Fed. Rep. of Germany

[21] Appl. No.: 119,359

[22] Filed: Nov. 10, 1987

[30] Foreign Application Priority Data

Nov. 11, 1986 [DE] Fed. Rep. of Germany ....... 3638399

[51] Int. Cl.$^4$ ............................................. H02H 3/20
[52] U.S. Cl. ...................................... 361/91; 261/93; 261/101; 261/103
[58] Field of Search ........................ 361/23, 24, 25, 30, 361/31, 33, 86, 87, 91, 93, 100, 101, 103; 265/56

[56] References Cited

U.S. PATENT DOCUMENTS 4,449,157  5/1984  Chew ........................... 361/91 X
4,602,308  7/1986  Montague ..................... 361/91
4,727,448  2/1988  Hanguda et al. ............. 361/91 X
4,750,079  6/1988  Foy et al. .................... 361/101

FOREIGN PATENT DOCUMENTS 0046962  3/1982  European Pat. Off. .
0154062  9/1985  European Pat. Off. .
0197707  10/1986  European Pat. Off. ............ 361/101
2482800  11/1981  France .
1141530  2/1985  U.S.S.R. ........................... 361/101

OTHER PUBLICATIONS

"GESmart Module Simplifies Motor Drive Design", Donald J. MacIntyre Jr., General Electric Company, 11/85.
"Smarte Power-Module", Klaus-Dieter Tetzlaff, Markt&Technik Nr. 15, vom. 11, Apr. 1986, pp. 78, 83–84.
"MOSFET Measures Current with No Loss", Frank Goodenough, Electronic Design, Feb. 20, 1986, pp. 59–60.
Travis; "Power-MOSFET Sense Terminal Allows No-Loss Load Sensing"; EDN, Jul. 10, 1986; p. 56.

Primary Examiner—Derek S. Jennings
Attorney, Agent, or Firm—David N. Caracappa

[57] ABSTRACT

In power switches, conductive coupling of the control signal inputs to the power switching stage, and to the load to be switched, can result in impairment of control function. Moveover these power switches known in the art, have the disadvantage that the drive circuit and power switching stage must lie at the same potential. An improved self protecting power switch includes a first drive unit and a second drive circuit that are connected together via a pulse transformer. The first drive unit generates successive pulse trains in response to a control signal. A second drive unit regenerates square wave signals for the control of the power switching stage.

7 Claims, 6 Drawing Sheets

CIRCUIT ARRANGEMENT OF A SELF PROTECTING POWER SWITCH

The invention relates to a circuit arrangement for a self protecting power switch.

Such circuit arrangements are known in the art, for example, as "GEsmart" from Markt & Technik, No. 15, 1986, Page 78 ff and designed as modules. Such modules are particularly provided for motor control. These power switches can control a module integrated power switching stage through the application of corresponding low level control signals to the connecting terminals. The control signal inputs are conductively coupled with the power switch stage. A control and monitoring device is arranged within the module which processes the control signals necessary for controlling the square wave signals for the control of the power switching stage. Moreover there are means in such self protecting power switches which inhibit the power switching stage in the event of a malfunction, and supply a status signal to a corresponding terminal.

Through the conductive coupling of the input side terminals for the control signals, supply voltage, etc., with the power switching stage and therewith the load to be switched, opposing effects of the output and input signals may occur which lead to malfunctions in the operation of the drive for the power switch. For example, upon switching of the power switching stage, voltage transients and/or overshoot may occur which feed back to the control signal and prevent dependable control. Moreover, such circuit arrangements have the disadvantage that they can, in general, be applied only where the drive circuit and the power switching stage operate at the same reference potential.

The object of the invention is to construct an intelligent, self protecting power switch in which all the signals necessary for control are transmitted potential free and therefore free of feedback effects between the input and output terminals of the power switch.

In accordance with principles of the invention, a self protecting power switch includes a first drive unit which generates successive pulse trains in response to a control signal. A pulse transformer is responsive to the successive pulse trains. A second drive unit regenerates square wave signals for controlling a power switchinig stage in response to the pulse trains transformed by the pulse transformer.

In The Drawings

Figure 1:
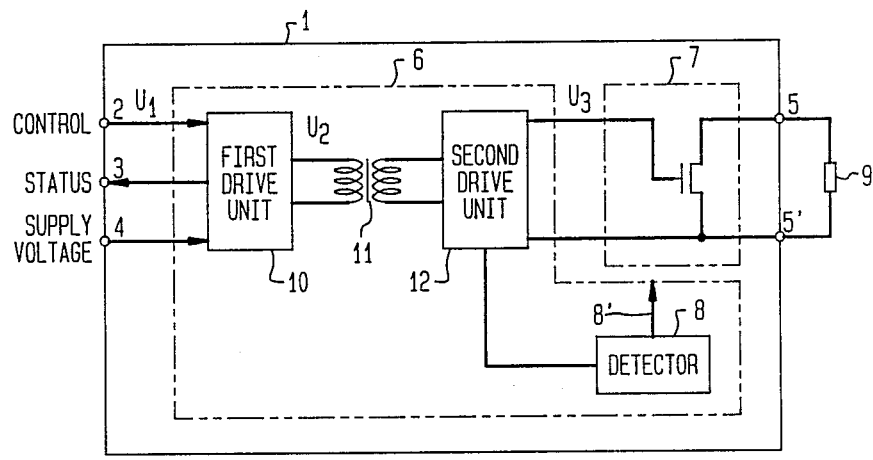
FIG. 1 is a block diagram of a self protecting power switch according to the invention.

The block diagram according to FIG. 1 shows a self protecting power switch 1, according to the invention, that is constructed as a module. The module is provided with terminals 2, 3, 4, 5, 5', at minimum, for a control signal, status indication, supply voltage and load, respectively. Within the module there is arranged, a drive and monitoring device 6, comprising at least a first drive unit 10 and a second drive unit 12, between which there is connected a pulse transformer 11. The first drive unit 10, is connected to a terminal 2 for the control signal, a terminal 3 for the status signal and a terminal 4 for the supply voltage. A power switching stage 7 is connected to the second drive unit 12 which is provided with terminals 5, 5' for the load 9 to be switched.

It is preferable for the control signal to the first drive unit 10 to be logic compatible e.g. designed to be V-CMOS and/or TTL-compatible. Should a suitable pulse width modulated control signal be impressed on terminal 2, means are provided in the first drive unit 10, which allocates pulse trains, responsive to this control signal, which are supplied to the second drive unit 12, correspondingly transformed via the pulse transformer 11.

This second drive unit 12 includes means which regenerate these pulse sequences into square wave signals which are appropriate for controlling the power switching stage 7. In addition, the drive and monitoring device 6 includes means 8 for detecting the occurrence of malfunctions, such as over current, overvoltage and overtemperature. A detected malfunction will cause the detecting means 8 to inhibit the power switching stage 7 i.e. the self protecting power switch 1 will not operate, regardless of the other signals, and additionally provide the first drive unit with an indication that a malfunction is present. This first drive unit 10, moreover, also contains means which recognize the occurance of a malfunction and generate a status signal that is present at the terminal 3.

Figure 2:
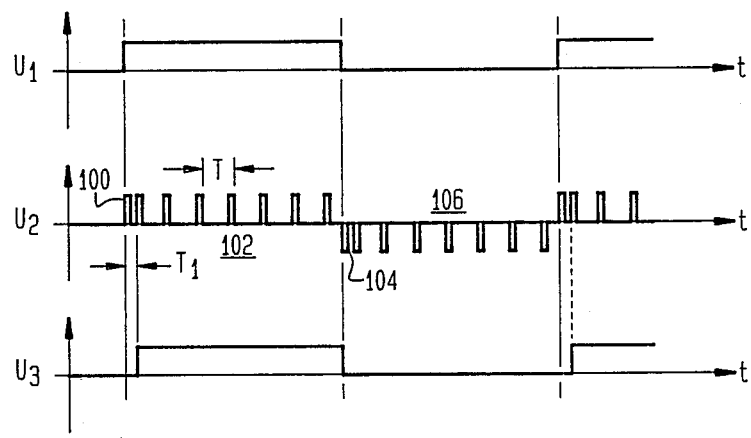
FIG. 2 is a waveform diagram useful in understanding the operation of the self protecting power switch illustrated in FIG. 1.

The possible waveform of a pulse width modulated control signal u1, which is present at terminal 2 is shown at the top of FIG. 2. A possible signal u2 as it is applied to the primary of the pulse transformer 11 and a corresponding square wave signal u3 for the control of the power switching stage 7 is shown at the bottom of FIG. 2. In response to a rising leading edge of the control signal u1, the signal u2, supplied to the primary of pulse transformer 11 includes a starting pulse 100, for example, generated in the first drive unit 10, which is followed by a pulse sequence 102 delayed by a time interval T1. This pulse train i.e. starting pulse 100 and following pulse sequence 102 has a positive polarity, for example. This pulse sequence is generated until the control signal returns to a logic "0" signal from logic "1" signal. In response to a falling trailing edge of the control signal u1, a starting pulse 104 is again generated, but now with negative polarity, which is again followed by a pulse sequence 106 again delayed by a time interval T1. Upon the next rising edge of the control signal u1, the polarity of the pulse train again becomes positive, and so forth.

The second drive unit 12 now regenerates a corresponding square wave signal u3, for the control of the power switching stage 7 from the pulse train signal u2 from pulse transformer 11 present at its input. The square wave signal u3, essentially corresponds to the control signal u1. However, the rising leading edge of the u3 square wave signal appears only after a time delay of T1 with respect to signal u1. For this purpose the second drive unit 12 may include a circuit which, upon encountering the rising leading edge of the first pulse of the pulse sequence with positive polarity, sets a flip-flop. The flip-flop is reset, upon encountering the rising leading edge of the starting pulse with negative polarity. The pulses in the pulse train may, for example, exhibit a period T of 100 microseconds. The pulse widths of the starting pulse and the pulses of the pulse trains may be equal, for example, and lie approximately between 300 nanoseconds and 1 microsecond, and the time delay T1 between the starting pulse and the pulse sequence may be selected to be somewhat longer than the pulse width.

The use of a pulse transformer as opposed to an ordinary transformer has the advantage that signals with narrow bandwidths can be transformed. The pulse transformer 11 may be so selected that the pulse is transformed without significant time delay and without significant change in pulse shape.

In the drive and monitoring device 6 shown in the block diagram of FIG. 1, additional means 8, are provided for the monitoring of overcurrent, overvoltage and overtemperature. A temperature sensor 8′ may be appropriately incorporated in the power switching stage 7, for detecting overcurrent, overvoltage and overtemperature, for example.

Figure 3:
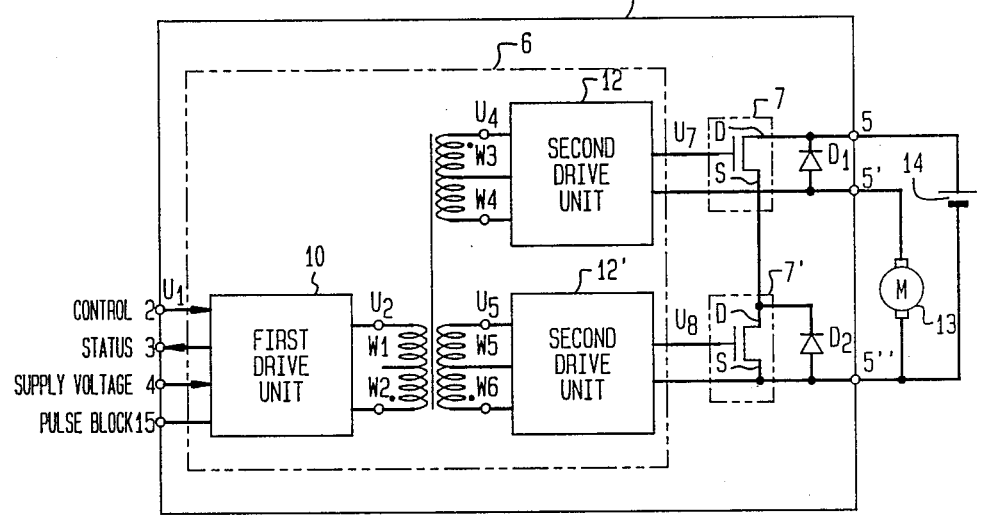
FIG. 3 is a block diagram of a self protecting power switch according to the invention for driving a half bridge.

FIG. 3 is a block diagram of a circuit arrangement, according to the invention, for driving a half bridge. This self protecting power switch 1, especially suitable for motor control, exhibits a drive and monitoring device 6. The drive and monitoring device 6 has a first drive unit 10, (which has already been described in connection with FIG. 1) which is provided with terminals 2, 3 and 4, for the control signal, status signal and voltage supply, respectively. The output of this first drive unit 10, is conencted to the primary side of a pulse transformer 11′, which has two secondary outputs operating in complement with each other. Second drive units 12 and 12′ are respectively connected to these two outputs. One of the second drive units 12, is provided for driving a first power switching stage 7 and the other second drive unit 12′, of identical construction, for driving a second power switching stage 7′. The overall drive and monitoring unit 6 includes means which are so related to each other that, for example, with an input signal u1=a logic "1" signal, the power switching stage 7 conducts and the power switching stage 7′ blocks, and that with an input signal u1=a logic "0" signal, the situation is respectively reversed.

These power switching stages 7 and 7′ may be field effect transistors, e.g. MOS-FETs, which are connected in a half bridge. For this purpose the source electrode of the MOS-FET in power switching stage in 7 is connected to the drain electrode of the MOS-FET in power switching stage 7′. This junction point is connected to an output terminal 5′ of the power switch 1. Two additional output terminals 5 and 5″, are connected with the drain electrode of the MOS-FET in power switching stage 7, and with the source electrode of the MOS-FET in power switching stage 7′, respectively. In addition, diodes D1 and D2, necessary for each half bridge control, are connected in polarity opposition to both MOS-FETs.

This self protecting power switch 1, for driving a half bridge is universally applicable to motor control. A simple control for a direct current motor 13 is achieved when the direct current motor 13 is connected between the connecting terminals 5′, 5″ and a corresponding direct voltage source 14 is connected between the terminals 5 and 5″.

As shown in FIG. 3, the self protecting power switch 1 is additionally provided with a further terminal 15 for a so called "pulse block" feature. When a pulse inhibiting signal is received from terminal 15, the entire power switch 1 is preemptively inhibited, i.e. the self protecting power switch 1 will not operate regardless of which control signal u1 is present at the connecting terminal 2. This is of particular advantage in providing a definite start-up of the power stage. For this purpose additional means are provided in the self protecting power switch 1 which will be described in detail with the aid of the following FIGS. 4 through 6.

Figure 4:
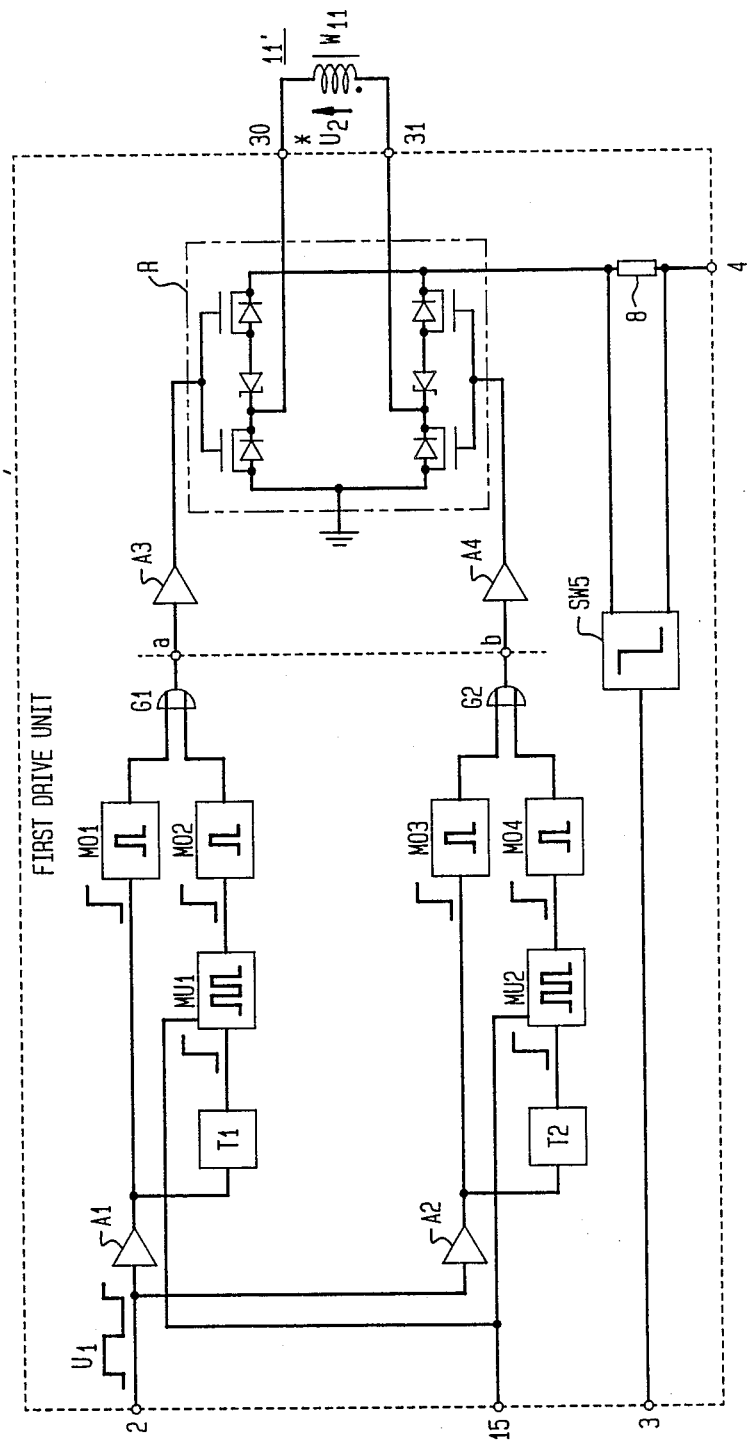
FIG. 4 is a block diagram of a first embodiment of a first drive unit according to FIG. 3 and/or 1.

Practical design examples of power switches for the various drive units 10, 12 and/or 12′ according to FIG. 3, and the related signal waveforms are described below. FIG. 4. illustrates a block diagram of an example of a circuit arrangement for a first drive unit 10. This circuit arrangement has a terminal 2 for receiving a control signal u1 and a terminal 15 for receiving the pulse inhibiting signal. The terminal 2 is coupled to input terminals of a non-inverting driver amplifier A1 and to an inverting driver amplifier A2. The output of the driver amplifier A1 is connected to a monostable MO1 which is triggered by rising edges, the output of which is tied to an OR-gate G1. The output of the driver amplifier A1 is also coupled through a delay element T1 to a multivibrator MU1, which is switched on in response to a logic "1" signal, the output of which is connected to a further input of the OR-gate G1 via a monostable MO2. The output of the OR-gate G1 is coupled to the driver amplifier A3 which is connected to both inputs of the half bridge. The half bridge employs MOS-FET, for example, with diodes connected in opposition. The anode side of the half bridge is at ground potential, while the cathode side of the half bridge is connected to the terminal 4 via a resistance 8. The positive side of a d.c. voltage source capable of delivering +15 V, for example, is connected to this terminal 4.

A monostable trigger stage MO3, and a series circuit consisting of delay element T2, multivibrator MU2 and monostable trigger stage MO4, with associated OR-gate G2, are connected to the output of the inverted driver amplifier A2 in a manner similar to the connection of the corresponding elements associated with driver amplifier A1, as described above. The output of OR-gate G2 is coupled to a driver amplifier A4, which is coupled to both inputs of an additional half bridge. This half bridge is constructed with the identical components mentioned above, i.e. MOS-FETs with diodes connected in polarity opposition for each branch of the half bridge. The anode side of this half bridge is coupled to the anode side of the above mentioned half bridge and the cathode side with the cathode side of the above mentioned half bridge, so that a full bridge rectifier R results. It is useful here to connect a Zener diode, in a known manner, to the half bridge branches which together form the full bridge, in order to ensure a definite demagnetizing voltage.

It must be mentioned here than an individual ground connection is provided in the first drive unit 10 that is not, however, shown in FIG. 4 for reasons of improved clarity. The terminal 4 also provides voltage to the individual active components and this is again not shown in FIG. 4. The output of the full bridge circuit is coupled to the output terminals 30, 31, to which the primary winding W11 of a pulse transformer 11' is connected.

For input current monitoring, the voltage drop across resistor 8 is detected, and coupled to a unit which can generate an output signal only when the current flowing in the resistance exceeds a specified level. This may be a threshold switch SW5, which generates an output signal when a corresponding reference value is exceeded. The output of this unit is coupled to the terminal 3 for the status signal.

The terminal 15, for the pulse inhibiting signal, is coupled to both multivibrators MU1 and MU2, which are preemptively inhibited by a corresponding pulse inhibit signal. A suitable circuit arrangement for this purpose may differ from that shown, for example, in that the output of the delay element T1 and/or T2 is not coupled directly the multivibrator MU1 and/or MU2 but instead is applied to the input of an AND-gate with two inputs, the output of which is connected to the multivibrator MU1 and/or MU2. At the same time the second input of the AND-gate is coupled to the terminal 15. Upon the application of a logic "0" signal to the connecting terminal 15 both multivibrators MU1 and MU2 are preemptively inhibited. For reasons of improved clarity, a detailed presentation of this feature has been deleted, and it is represented only schematically as a connecting lead between the terminal 15 and the multivibrators MU1 and MU2.

Figure 8:
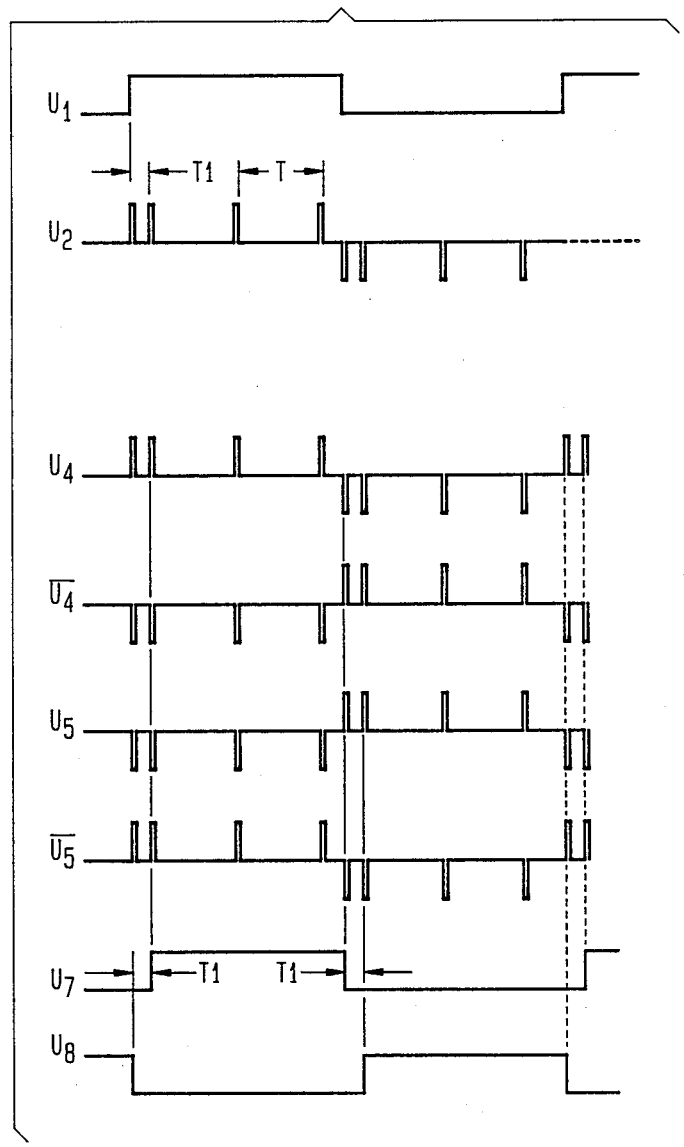
FIG. 8 is a waveform diagram useful in understanding the operation of the circuits illustrated in FIGS. 3, 4 and 6.

In order to clarify the operating mode of this first drive unit (10) reference is made to the associated signal waveforms in FIG. 8. Assume u1 to be the control signal applied to the terminal 2. This control signal u1 is supplied via non-inverting amplifier A1 to a monostable trigger stage MO1, which generates a pulse, i.e. a starting pulse, at a rising edge. The pulse sequence, delayed by a time interval T1 is generated by the multivibrator MU1, and the following monostable trigger stage MO2. The multivibrator MU1 oscillates as long as a logic "1" is present at its input and monostable trigger stage MO2 generates a pulse at each rising edge at its input terminal. The starting pulse and the pulse sequence are each directed to the OR-gate G1. A similar pulse sequence is present at gate G2, however, only after a trailing edge when the control signal is at logic "0". The outputs of the gates G1 and G2, respectively control corresponding driver amplifiers A3 and A4, the outputs of which are coupled to the inputs of the full bridge R. The associated signal waveform u2 at the primary winding W11, of the pulse transformer 11, is shown in FIG. 8. It is clearly seen that the polarity of the pulse trains is positive when the control signal at input terminal 2 is a logic "1" signal and negative when the control signal is a logic "0" signal.

Figure 5:
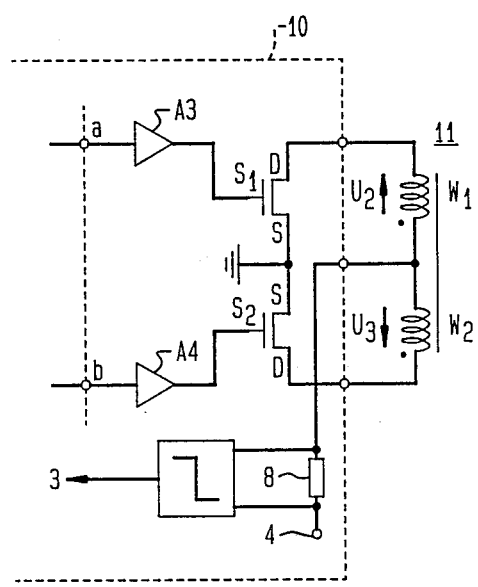
FIG. 5 is a block diagram of a second embodiment of a first drive unit according to FIG. 3 and/or 1.

Another embodiment for a first drive unit (10) is presented in FIG. 5. The circuit arrangement differs from that in FIG. 4, in that the outputs of the driver amplifiers A3 and A4 are not connected to a full bridge but instead, to two circuit elements S1 and S2. The output terminal of the driver amplifier A3, for example, is connected the gate electrode of a MOS-FET S1. The source electrode of MOS-FET S1 is at ground potential and the drain electrode is brought to the terminal 4, via a primary winding W1, of a pulse transformer 11 and series connected resistance 8. The gate electrode of a second MOS-FET S2 is connected to the output of the driver amplifier A4. The source electrode of this second MOS-FET S2 is at ground potential and the drain electrode is coupled to the junction of the resistance R8 and the winding W1, via a second primary winding W2 of the pulse transformer 11. The sense of the winding of both primaries is so selected, that upon alternate switching of S1 and S2, voltages of differing polarity are induced in the secondary winding of the pulse transformer 11. The sense of the winding is indicated by a dot on the respective winding of FIG. 5.

Here too, as already described in connection with FIG. 3, provision is made to direct the voltage drop across resistance 8 to a threshold level switch, for example.

Figure 6:
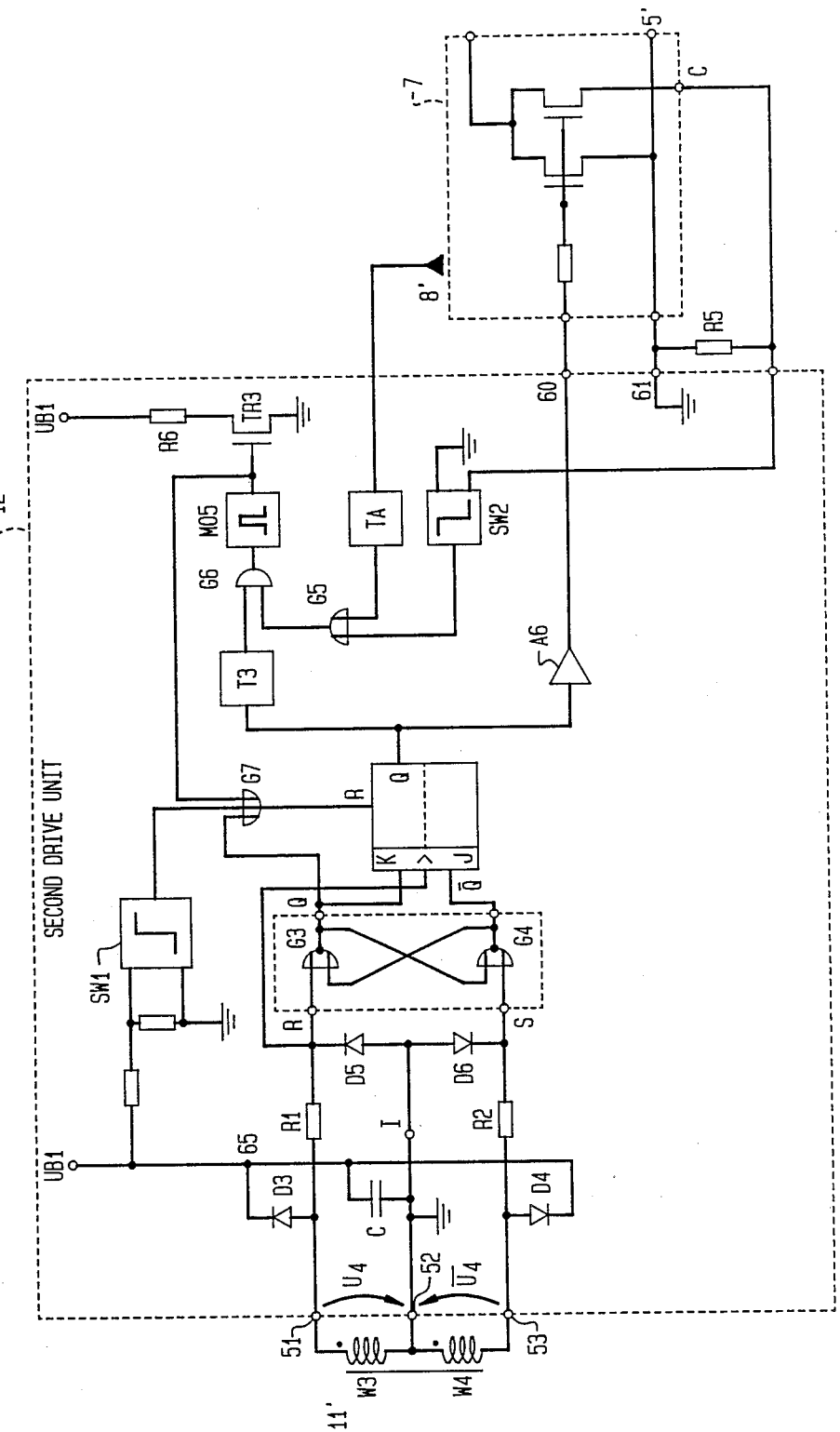
FIG. 6 is a block diagram of an embodiment of a second drive unit according to FIG. 3 and/or 1.

FIG. 6 shows a circuit arrangement for a second drive unit 12, which is coupled to the secondary side of pulse transformer 11'. The secondary side exhibits a winding pair W3 and W4. The windings W3 and W4 are connected in series in the same winding sense. The junction point of the two windings W3 and W4, is coupled to a terminal 52. The other two ends of the windings W3 and W4 are coupled to terminals 51 and 53, respectively. The sense of the windings of these secondary winding pairs is indicated by corresponding dots in FIG. 6.

The second driving unit 12, includes an RS (reset/-set)-flip-flop comprised of two NOR-gates G3 and G4. The R input of the RS-flip-flop is connected to the terminal 51 via a resistance R1, and the S input of the RS-flip-flop to the terminal 53 via a resistance R2. Additionally, the R and S inputs are respectively coupled to the cathodes of diodes D5 and D6. The anodes of these two diodes D5 and D6 are coupled to the terminal 52, which also serves for the reference potential of the second drive unit. The non-inverted output Q of the RS-flip-flop is connected to the K input terminal and the inverted output $\overline{Q}$ the J input of a JK-flip-flop. The clock input of this JK-flip-flop is, at the same time, coupled to the junction point of the resistance R1, and the R input of the RS-flip-flop. The JK-flip-flop exhibits an additional input terminal R, which resets the JK-flip-flop upon the application of a logic "1" signal. This additional input of the JK-flip-flop is coupled to the output of an Or-gate G7. A first input of the Or-gate 7, is coupled to the Q output of the RS-flip-flop. The Q output of the JK-flip-flop is provided to a terminal 60, for a power switching stage 7, via a corresponding driver amplifier A6. An additional terminal 61, for the power switching stage 7, is connected to the reference potential. The gate electrode of a power MOS-FET may, for example, be connected to the terminal 60, via a decoupling resistance. The source electrode of this MOS-FET may be coupled to the terminal 61.

Two diodes D3 and D4, and a capacitor C, are provided for a potential free current supply for the complete second drive unit 12. The anode of the diode D3 is coupled to the terminal 51, and the anode of the diode D4 is coupled to the terminal 53. The cathodes of the diodes D3 and D4 are connected together. The capacitor C lies between this junction point 65, and the reference potential. The necessary voltage UB1, for the voltage supply of the second drive unit 12, which is derived through rectification of the positive and negative pulse trains, is then generated at node 65. A threshold level switch SW1 is connected to node 65 via a voltage divider. The output of this threshold level switch SW1, is coupled to a second input terminal of the OR-gate G7. Should the voltage exceed a given value, the threshold limit switch SW1 applies a logic "1" signal to the input of the OR-gate G7.

The Q output of the JK-flip-flop is also coupled to an input terminal of an AND-gate G6, via a delay element T3. The other input terminal of this AND-gate G6 is connected to an output terminal of an OR-gate G5. This OR-gate G5 has two input terminals, which input terminals are coupled to a threshold level switch SW2, and a temperature sensing arrangement TA. The threshold level switch SW2 is provided in order to measure the load current of the power switch. Should the load current exceed a given limit, the threshold level switch SW2 applies a logic "1" signal to the input terminal of OR-gate G5. The temperature sensing arrangement TA serves the purpose of sensing a possible overtemperature at the power switch, and of signalling this to the input terminal of the OR-gate G5 with a logic "1" signal. In the simplest case this temperature sensing arrangement consists of a temperature sensor 8', that is physically mounted on the power switching stage 7.

The output terminal of the AND-gate G6 is connected to the input terminal of a monostable trigger stage MO5, which exhibits a switch-on delay in the order of 1 to 10 milliseconds. The output terminal of this monostable trigger stage MO5 is connected to a third input terminal of the OR-gate G7 and the gate electrode of a field effect transistor TR3, for example. The source electrode of this field effect transistor TR3, is at the reference potential, and the drain electrode of the field effect transistor TR3 is coupled to the node 65, via a resistance R6.

Figure 7A:
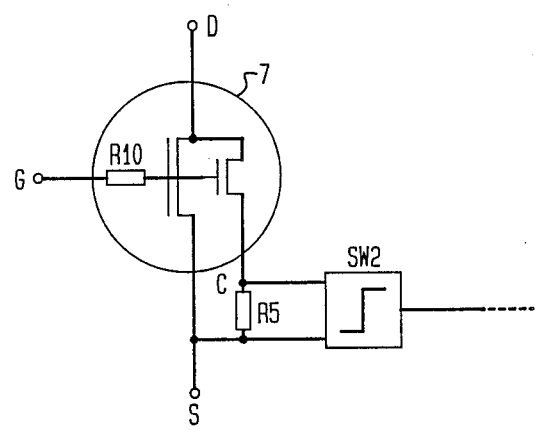
FIG. 7a is a schematic diagram of a first embodiment for a power switching stage.
Figure 7B:
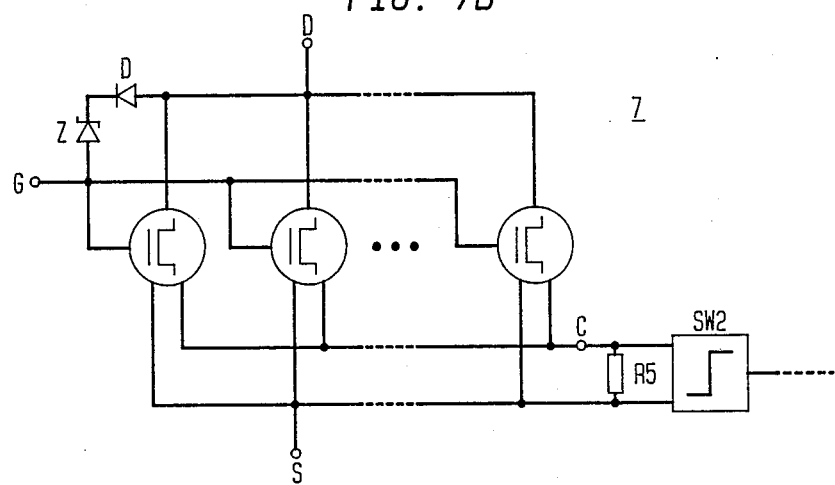
FIG. 7b is a schematic diagram of a second embodiment for a power switching stage.

FIGS. 7a and 7b show examples of power switching stages 7. FIG. 7a shows a power MOS-FET with four connections, i.e. a gate electrode G, with series connected decoupling resistance R10, a drain electrode D, a source electrode S and an integrated current sensor output electrode C. The current flowing in this integrated current sensor C provides a very good estimate of the load current. An example of such of MOS-FET is described in EDN, July 10, 1986, for example.

FIG. 7b illustrates a power switching stage including a number of parallel connected power MOS-FETs, such as those shown in FIG. 7a. Higher currents may be switched by such a circuit. A snubber circuit is provided for the supression of transient overvoltages. For this purpose, the anode of a Zener diode Z is connected to the common gate electrodes of the parallel circuit. The cathode of the Zener diode Z is coupled to the cathode of a diode D. The anode of this diode D is coupled to the common drain electrodes of the Parallel connected MOS-FET.

The second drive unit 12 is connected to the power stage 7, as illustrated in FIG. 7a and/or 7b in such manner, that the gate electrode G is coupled to the terminal 60 and the source electrode S is coupled to the terminal 61. The voltage drop across resistance R5, connected between the current sensor output C and the source electrode S, for load current monitoring, is coupled to the threshold level switch SW2. Threshold level switch SW2, upon receiving a signal exceeding a corresponding reference value, generates a logic "1" signal at its output. The load is then coupled between the source electrode S and the drain electrode D of the power switching stage 7 and/or the power switching stage 7', in a known manner.

The operating mode of the second drive unit 12, in conjunction with the drive of the half bridge according to FIG. 6, is explained above with the aid of FIG. 8. Waveform u2 of the pulse train is transformed at the two secondary outputs of the pulse transformer 11' (of FIG. 3) operating in complement with each other. The pulse transformer 11' thus exhibits two complementary working winding pairs, i.e. the winding pair W3, W4 and the winding pair W5, W6. The second drive unit 12 is connected to the winding pair W3, W4 and the second drive unit 12' is connected to the winding pair W5, W6. Both drive units 12 and 12' are of identical construction. The voltage u5 appears between the terminals 51 and 52 of the second drive unit 12', the voltage $\overline{u5}$ correspondingly appears between the terminals 53 and 52.

Referring again to FIG. 6, after the u1 signal becomes a logic "1" signal, and because of the delay introduced by the RS-flip-flop, the Q output terminal of the JK-flip-flop in the corresponding drive unit 12 produces a logic "1" signal at the second positive pulse of the u4 signal between input terminals 51 and 52. This logic "1" signal causes the power switching stage to switch on. Previously the JK-flip-flop was reset with the corresponding first negative pulse of u4 (or the first positive pulse of $\overline{u4}$) and the power switching stage 7' switched off. The switch-on delay time interval of T1 provided thereby, ensures that the power switching stages 7 and 7' can never conduct at the same time.

When the u1 signal becomes a logic "0" signal, and at the first negative pulse of the u4 signal, the power switching stage 7 is switched off, and after a delay of T1, the power switching stage 7' is switched on with the second positive pulse of the u5 signal.

FIG. 8 shows the regenerated square wave signal u7 in the second drive unit 12 for controlling the power switching stage 7, and the corresponding regenerated square wave signal u8, from the second drive unit 12' for controlling the power switching stage 7'.

Both power switching stages 7 and 7' are simultaneously inhibited when the pulse trains with the period T are suppressed on the primary side of pulse transformer 11' through the "pulse inhibit" signal at input terminal 15. The JK-flip-flops in the second drive units 12 and 12' never receive a 'set' signal, but the 'reset' events remain unaffected. Thus, even though an alternating control signal u1 is present at control input terminal 2, the pulse inhibit signal at input terminal 15 causes the power switching stages 7 and 7' to be inhibited.

Referring again to FIG. 6, a detected malfunction, such as overcurrent and/or overtemperature and/ overvoltage is handled through setting the monostable trigger stage MO5, which preemptively inhibits the power switching stage 7. At the same time a load resistance R6 is switched in which brings about an increased current input, which is detected and signaled. Thus, for example, an overcurrent is detected by means of a source side current sensor (R5), and the monostable trigger stage (SW2), which inhibits the power switching stage 7 via the OR-gate G5. The current testing is carried out, respectively, when the Q output of the JK-flip-flop is a logic "1" signal, and after a delay of T3. The delay is provided so that detection of overly high currents during commutation, are not reported as malfunctions. The setting of monostable trigger stage MO5 is also brought about by the temperature sensitive arrangement TA. The monostable trigger stage MO5 again switches in an additional loading R6 for UB1, which is detected on the primary side of the pulse transformer 11'. The voltage UB1 is monitored by means of the threshold level switch SW1. If any of the malfunctions are detected, the JK-flip-flop is reset via the OR-gate G7.

I claim:

1. In a circuit arrangement of a self protecting power switch, including: respective terminals for a control signal, a supply voltage, a status signal and a load, and a power switching stage; a drive and monitoring device for driving and monitoring said power switching stage in response to said control signal, comprising:
    a first drive unit for generating successive pulse trains in response to the control signal;
    a pulse transformer responsive to said pulse trains; and
    a second drive unit including means for generating square wave signals for the control of the power switching stage in response to said pulse trains transformed by the pulse transformer, for detecting malfunctions of the power switching stage, and for inhibiting the power switching stage, and signalling the first drive unit in the event of a malfunction.

2. The device according to claim 1, wherein the drive and monitoring device further comprises means which preemptively inhibit the power switching stage in response to a pulse inhibit signal.

3. The device according to claim 1 wherein the circuit arrangement comprises transistors with field effect control inputs.

4. The device according to claim 1 wherein said second drive unit comprises a rectifying arrangement for generating a supply voltage for the second drive unit from the transformed pulse trains from the pulse transformer.

5. The device according to claim 1, wherein:
    each of the successive pulse trains exhibits a starting pulse and a following delayed pulse sequence; and
    the first pulse of the delayed pulse sequence defines the beginning of the square wave signal for the control of the power switching stage, and that the starting pulse of the next succeeding pulse train defines the end of the square wave signal.

6. The device according to claim 1, wherein:
    said second drive unit further comprises means for connecting a second load in parallel with the output of the pulse transformer in the event of a detected malfunction, thereby causing a higher current on the primary side of the pulse transformer; and
    said first drive unit further comprises means for detecting this higher current and generating a corresponding status signal.

7. In a circuit arrangement of a self protecting power switch, including: respective terminals for a control signal, a supply voltage, a status signal and a load, and a first and a second power switching stage; a drive and monitoring device for driving and monitoring said first and second power switching stages in response to said control signal, comprising:
    a first drive unit for generating successive pulse trains in response to the control signal;
    a pulse transformer responsive to said pulse trains and including two complementary working secondary winding pairs;
    a second drive unit including means for generating square wave signals for the control of the first power switching stage in response to said pulse trains transformed by a first one of said secondary winding pairs of the pulse transformer, for detecting malfunctions of the first power switching stage, and for inhibiting the self protecting power switch, and signalling the first drive unit in the event of a malfunction; and
    a third drive unit including means for generating square wave signals for the control of the second power switching stage in response to said pulse trains transformed by the other one of said secondary winding pairs of the pulse transformer, for detecting malfunctions of the second power switching stage, and for inhibiting the self-protecting power switch, and signalling the first drive unit in the event of a malfunction.

* * * * *